(12) United States Patent
Nishimura et al.

(10) Patent No.: US 6,804,271 B2
(45) Date of Patent: Oct. 12, 2004

(54) LIGHT EMISSION METHODS AND LIGHT EMISSION DEVICES

(75) Inventors: Ken Nishimura, Fremont, CA (US);
Scott Corzine, Sunnyvale, CA (US);
Frank H. Peters, San Jose, CA (US);
Gary Gordon, Saratoga, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 263 days.

(21) Appl. No.: 10/011,503

(22) Filed: Nov. 6, 2001

(65) Prior Publication Data

US 2003/0086450 A1 May 8, 2003

(51) Int. Cl.⁷ ............................................... H01S 3/10
(52) U.S. Cl. ........................... 372/27; 372/43; 372/44; 372/45; 372/46; 372/47; 372/48; 372/49; 372/50; 372/99; 372/105
(58) Field of Search .............................. 372/27, 43–50, 372/99, 105

(56) References Cited

U.S. PATENT DOCUMENTS

| | | | | |
|---|---|---|---|---|
| 5,218,610 A | * | 6/1993 | Dixon | 372/20 |
| 5,675,593 A | * | 10/1997 | Oka | 372/21 |
| 5,862,165 A | * | 1/1999 | Handa et al. | 372/27 |
| 5,909,456 A | * | 6/1999 | Oka | 372/22 |

* cited by examiner

*Primary Examiner*—Don Wong
*Assistant Examiner*—Delma R. Flores Ruiz

(57) ABSTRACT

Light emission methods and light emission devices are described including method and devices capable of emitting light at a plurality of controllable wavelengths. According to one aspect, a light emission method includes providing a control signal and emitting light using a laser operating in a plurality of polarization states. The polarization state of the laser is adjusted responsive to the control signal and the wavelength of the light emitted using the laser is adjusted responsive to the adjustment of the polarization state of the laser.

20 Claims, 2 Drawing Sheets

LIGHT EMISSION METHODS AND LIGHT EMISSION DEVICES

TECHNICAL FIELD

The invention relates to light emission methods and light emission devices.

BACKGROUND OF THE INVENTION

Semiconductor lasers are utilized in a wide variety of applications including fiber-optic applications. The relatively small size, low input power requirements and high power conversion efficiencies of semiconductor lasers make them well-suited for fiber-optic applications.

Conventional semiconductor laser configurations are implemented as diodes typically consisting of multiple epitaxial layers provided upon an appropriate substrate, such as indium phosphide. An active layer, such as indium gallium arsenide phosphide, is sandwiched between n and p-type cladding layers of the substrate material in some conventional configurations. Opposing metal contacts are provided about the structure and a bias current is applied to the contacts to generate light at a wavelength determined by the energy gap of the active layer.

Many conventional semiconductor laser configurations are not accurately controllable to operate between a plurality of wavelengths, and it may not be desirable for the laser to vary in wavelength. In some applications, including wavelength division multiplexing (WDM) and frequency division multiplexing (FDM) applications, a plurality of lasers are precisely tuned to their respective channels for communication.

Indeed, temperature sensors and controls are utilized to maintain the operating temperature constant to avoid variances in wavelength due to temperature fluctuations.

However, in some applications it may be desirable to provide controlled emission of light at a plurality of different wavelengths. For example, such devices could be utilized in optical communication architectures which use wavelength to distinguish different information states.

SUMMARY OF THE INVENTION

The invention relates to light emission methods and light emission devices. Aspects of the invention provide methods and devices capable of emitting light at a plurality of controllable wavelengths. According to one exemplary implementation, emission of light at plural controllable wavelengths as described herein is utilized to distinguish different informational states or select a plurality of desired communication paths.

The present invention implements changes in wavelength of emitted light from a source responsive to changes in lasing mode of a laser in an exemplary configuration. In the exemplary arrangement, the lasing mode polarization of the laser is switched to implement switching of wavelength of the emitted light from the source using birefringent material in an optical path of the laser.

According to one embodiment, switching the polarization is accomplished by making the threshold for lasing of a particular polarization state less than the other. Light having the same wavelength and polarization as the desired wavelength may be selectively injected into a cavity of the source to switch the wavelength of light emitted from the source in one possible arrangement. The source typically operates in a default polarization state providing light having a corresponding wavelength.

The polarization state and the wavelength of emitted light change responsive to the injection of appropriate light. In particular, the lasing mode polarization of a laser in the cavity changes responsive to injection of external light. Birefringent material in the cavity operates to change the wavelength of emitted light from the source responsive to changes in the lasing mode polarization of the laser. Accordingly, the light is controllably injected into the cavity to control the wavelength of emitted light from the source in one exemplary embodiment.

In another implementation, electrically-controllable birefringent material is provided within an optical cavity of a source to selectively induce loss for one polarization state of a laser within the cavity enabling control of emitted light at a plurality of wavelengths. The birefringent material is controlled to control the emission of light at the plurality of desired wavelengths in such an arrangement. In one exemplary implementation, the controllable birefringent material induces loss for one polarization state responsive to control from a control signal which enables control of the operation of the laser in a plurality of polarization states. Other birefringent material within the cavity changes the wavelength of light emitted from the source responsive to changes in the lasing mode polarization of the laser.

Other implementations for controlling the polarization state of a laser are contemplated.

Accordingly, one aspect of the invention provides a light emission method. The method according to this aspect includes providing a control signal and emitting light using a laser operating in a plurality of polarization states. Adjustment of the polarization state of the laser responsive to the control signal and adjustment of the wavelength of the light responsive to the adjustment of the polarization state of the laser are provided.

The invention further discloses another light emission method. This aspect includes controlling the operation of a semiconductor laser in a plurality of polarization states. Further, emitting light having a plurality of wavelengths is provided using the semiconductor laser and corresponding to the respective polarization states.

Another aspect of the invention provides a light emission device comprising an interface adapted to receive a control signal and a laser configured to operate in a plurality of polarization states to emit light. This aspect further provides a mode selection device configured to adjust the polarization state of the laser responsive to the control signal and a wavelength adjustment device configured to adjust the wavelength of the light responsive to the adjustment of the polarization state.

As is apparent from the foregoing, the present invention has both method and structural aspects. The present invention provides methods and structures capable of accurate emission of light having a plurality of selectable wavelengths. Certain embodiments of the invention provide other advantages in addition to or in lieu of the advantages described above, as is apparent from the description below with reference to the following drawings.

BRIEF DESCRIPTION OF THE DRAWINGS

Preferred embodiments of the invention are described below with reference to the following accompanying drawings depicting examples embodying the best mode for practicing the invention.

DETAILED DESCRIPTION OF THE INVENTION

Like references herein are utilized to depict like components with differences therebetween being represented by a distinguishing suffix such as "a".

Figure 1:
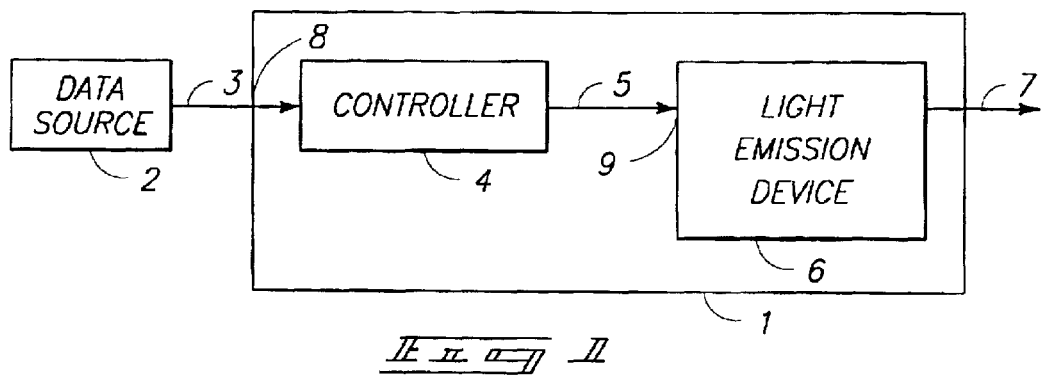
FIG. 1 is a functional block diagram of an exemplary optical communication device.

Referring to FIG. 1, an exemplary optical communication device 1 is depicted coupled with a data source 2. The optical communication device 1 is described herein with reference to an optical network application wherein optical communication device 1 is an originating source device configured to provide optical signals for communication of information using a plurality of wavelengths. Optical communication device I may be implemented in other applications where it desired to provide a source device capable of generating multiple wavelengths of light.

Optical communication device 1 includes a controller 4, a light emission device 6, and an interface 8 in the exemplary configuration.

Data source 2 is configured to couple with interface 8 of optical communication device 1. Data source 2 is configured to output a data A signal 3 comprising an electrical signal in the described embodiment, and having data embodied therein for communication using optical communication device 1.

Exemplary configurations of data source 2 include any source having information for communication within an optical network, using a fiber-optic medium (not shown) for example, and may be implemented as a source device of a data interconnect, a source device implemented within a central office, or other originating source providing data to be communicated by optical communication device 1. Data source 2 outputs data signal 3 comprising digital data in one exemplary embodiment. Optical communication device 1 is configured to originate the information in an appropriate format for communication within an associated medium.

Interface 8 is configured to receive data signal 3 which embodies the data to be communicated. Controller 4 receives the data signal from interface 8. Controller 4 is configured to output a control signal 5 responsive to the received data signal 3. Control signal 5 is provided as an electrical signal to control light emission device 6 to communicate the data received within data signal 3. Device 6 includes an interface 9 configured to receive control signal 5.

In one exemplary embodiment, controller 4 is configured to vary an electrical characteristic of control signal 5, such as voltage or current, responsive to data signal 3 and to control light emission device 6 to communicate the received data. Controller 4 may be implemented as processing circuitry configured to execute firmware and/or software instructions stored within an appropriate memory device (not shown). Alternatively, controller 4 is implemented as a hardware circuit to control functions described herein.

According to other aspects, controller 4 varies control signal 5 to control device 6 to implement operations other than communication of data using device 6. In one alternative embodiment, controller 4 outputs control signal 5 to control communication of an optical signal 7 in one or more selected communication path. For example, such paths may correspond to respective wavelengths of light and controlling device 6 to emit optical signal 7 having different wavelengths controls the path in which signals 7 are communicated. More specifically, when signal 7 is desired to be communicated in one path controller 4 operates device 6 to emit signal 7 having a first wavelength spectrum and controller operates device 6 to emit signal 7 having a second different wavelength spectrum when signal 7 is desired to be communicated in another path. Signals 7 may be modulated apart from operations of device 6 if desired for communication of data or for other reasons. Accordingly, controller 4 provides control signal 5 to toggle the operations of control device 6 to emit optical signals having different wavelengths for communication of data or for other operations.

Light emission device 6 is configured to output an optical signal 7 embodying data originated from data source 2 for communication to an appropriate destination device (not shown) via an appropriate medium. In an exemplary configuration, optical communication device 1 is coupled with an appropriate waveguide, such as an optical fiber, free space or other appropriate medium to communicate optical signals 7 to one or more destination device. According to aspects of the present invention, light emission device 6 is configured to modulate the optical signal 7 responsive to the control signal 5 to communicate the data from data source 2.

Figure 2:
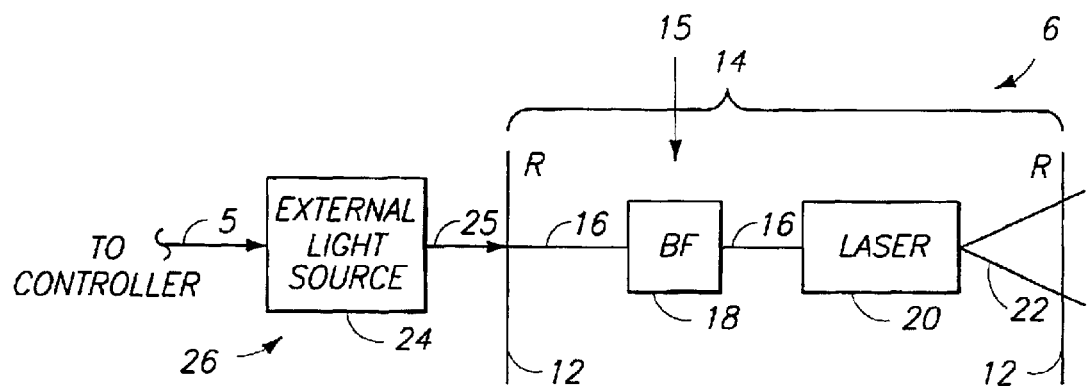
FIG. 2 is an illustrative representation of an exemplary light emission device of the optical communication device.

Referring to FIG. 2, exemplary components of one possible configuration of light emission device 6 are shown. As illustrated, light emission device 6 includes a plurality of opposing mirrors 12 which define a cavity 14. A wavelength adjustment device 15 and a laser 20 are provided within cavity 14. The depicted light emission device 6 additionally comprises a mode selection device 26 coupled with controller 4 and optically coupled with cavity 14 in the described exemplary configuration.

As described in detail herein, light emission device 6 and optical communication device 1 output light within an optical signal 22 having at least two wavelengths (optical signal 22 corresponds to optical signal 7 of FIG. 1). Light emission device 6 is arranged to switch between emission of light at the at least two different wavelengths for use in optical communication architectures that use wavelength to distinguish different information states. Alternatively, light emission device 6 is used in other appropriate applications wherein emission of light having plural wavelengths is desired.

Laser 20 is implemented as a semiconductor laser, such as a vertical cavity surface emitting laser(VCSEL) or an edge emitting laser, in exemplary arrangements. Other implementations of laser 20 are possible. Laser 20 operates in a plurality of lasing modes including different polarization states.

According to aspects of the present invention, switching the lasing mode polarization of laser 20 results in a corresponding change in wavelength of emitted optical signal 22. In accordance with exemplary aspects of the invention, changing the lasing mode polarization of light emission device 6 is accomplished by making the threshold for lasing of one of the polarization states less than the other. Further details regarding control of the lasing mode polarization and wavelength of light emitted from laser 20 and light emitting device 6 are described below.

An optical path 16 is provided intermediate opposing mirrors 12 as shown. Wavelength adjustment device 15 and laser 20 are optically coupled with the optical path 16 within cavity 14. Laser 20 operates in lasing modes having plural polarization states to emit light 22 externally of cavity 14. Mode selection device 26 is configured to control the polarization state of laser 20 responsive to the control signal 5 to implement changes in wavelength of light emitted from device 6. One exemplary method to control the polarization state of laser 20 is to reduce the threshold for lasing in one polarization state to a value less than the other polarization state as mentioned above. Mode selection device 26 disclosed herein controls selective reduction of threshold for lasing of laser 20 in a desired polarization state. Alternative configurations of mode selection device 26 are possible, some of which are described herein.

The mode selection device 26 shown in FIG. 2 is illustrated optically coupled with cavity 14 and electrically coupled with controller 4 to receive control signals 5. In the depicted first exemplary embodiment, mode selection device 26 is implemented as an external light source 24 optically coupled with cavity 14. External light source 24 is configured to output optical signal 25 responsive to control signal 5 according to one exemplary embodiment. In one implementation, control signal 5 is a digital signal having two information states. External light source 24 is configured to intensity modulate optical signal 25 to adjust the threshold of lasing of a given polarization state of laser 20 responsive to the information states of control signal 5.

Mode selection device 26 implemented as an external data source 24 applies the optical signal 25 to cavity 14 to reduce the threshold for lasing of one polarization to a value less than the other polarization. In particular, external data source 24 is configured to optically inject light into cavity 14 of the same wavelength and polarization as the desired lasing mode. Accordingly, laser 20 typically operates in a lasing mode of a given polarization state in the absence of light from source 24. Such is referred to herein as a default polarization state. Optical signal 22 emitted from light emission device 6 has a default wavelength corresponding to the default polarization state of laser 20. Optical signal 22 having the default wavelength corresponds to a default information state, such as a logic one or zero in exemplary digital applications. Accordingly, laser 20 and light emission device 6 are configured such that laser 20 typically operates in the default polarization state.

Mode selection device 26 selectively controls laser 20 to provide optical signal 22 corresponding to another information state distinguishable from the default information state to communicate data provided within control signal 5 and data signal 3. Mode selection device 26 controls optical signal 22 corresponding to the another information state by reducing the threshold for lasing of laser 20 in another polarization state to less than the threshold for lasing in the default polarization state. Mode selection device 26 implemented as external light source 24 is configured to output optical signal 25 comprising light having a desired wavelength and polarization substantially the same as the light comprising optical signal 22 during the another information state and having a wavelength and polarization different than the default information state. Optical signal 25 is selectively optically injected into cavity 14 using external light source 24 responsive to control from controller 4 to control the polarization state of laser 20.

Accordingly, control signal 5 controls external light source 24 to selectively output optical signal 25 to control laser 20. Laser 20 emits optical signals 22 having the default and another wavelength corresponding to data within received data signal 3. According to the described exemplary aspect, control signal 5 controls intensity modulation of external light source 24 between an on and off condition to selectively emit optical signal 25 corresponding to data within data signal 3. Responsive to the intensity modulated optical signal 25, laser 20 switches between the default polarization state and another polarization state.

Wavelength adjustment device 15 is configured to adjust the wavelength of light of optical signal 22 emitted from light emission device 6 responsive to the adjustment of the polarization state of laser 20. In particular, wavelength adjustment device 15 controls the emission of light within optical signal 22 corresponding to the default wavelength during operation of laser 20 in the default polarization state. Wavelength adjustment device 15 also controls the emission of light within optical signal 22 corresponding to another wavelength during operation of laser 20 in another polarization state to distinguish information states within optical signal 22 and corresponding to data within data signal 3.

Wavelength adjustment device 15 is implemented as birefringent material 18 within cavity 14 in the described exemplary embodiment. Wavelength adjustment device 15 comprising birefringent material is provided intermediate mirrors 12 within cavity 14 and coupled with optical path 16. Wavelength adjustment device 15 has a plurality of indexes of refraction corresponding to respective polarization states of laser 20. Accordingly, the provision of different indexes of refraction dependent upon the polarization state of the lasing mode of laser 20 results in different optical lengths of device 18 and optical path 16 having different optical path lengths dependent upon the polarization state of laser 20. Accordingly, switching the lasing mode polarization of laser 20, switches the optical path length of cavity 14 resulting in optical signal 22 having light of different distinguishable wavelengths corresponding to the selective application of optical signal 25 responsive to data signal 3. It follows that optical signal 22 having the plurality of wavelengths may be utilized to communicate data within data signal 3.

Figure 3:
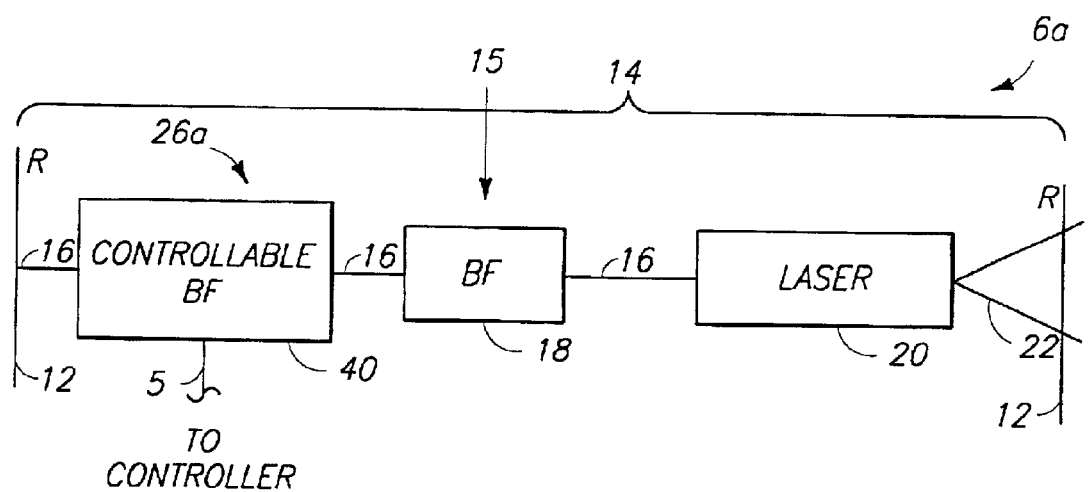
FIG. 3 is an illustrative representation of an exemplary alternative light emission device.

Referring to FIG. 3, an alternative configuration of the light emission device of optical communication device 1 is depicted as reference 6a. In the depicted arrangement of light emission device 6a, mode selection device 26a is provided in an alternative configuration within cavity 14. In the illustrated exemplary embodiment, mode selection device 26a is implemented as a controllable birefringent material 40. In the described embodiment, controllable birefringent material 40 is controlled by an electrical signal, such as control signal 5 from controller 4. Exemplary electrically-controllable bifringement material may be implemented as liquid crystal material placed within optical cavity 14. The controllable bifringement material 40 is placed in cavity 14 or at the edges of optical cavity 14 in exemplary arrangements to induce excessive loss for one of the polarization states according to aspects of the present invention.

Mode selection device 26a comprising controllable birefringent material 40 changes cavity loss of light having one polarization relative to the other responsive to control signal 5 from controller 4. More specifically, mode selection device 26a is configured to induce loss for one of the polarization states within the cavity 14 responsive to the control signal 5.

For example, as described above, laser 20 is configured to typically emit light having a default polarization and device 6 emits light as optical signal 22 having a corresponding default wavelength. Control signal 5 applied to material 40 has plurality levels corresponding to informational states of data within data signal 3. A default level of control signal 5 results in relatively no loss for the default polarization state of laser 20 via material 40. Upon assertion of another level of control signal 5, material 40 operates to induce excessive loss for the default polarization state of laser 20 causing laser 20 to operate in the another polarization state. As described above, changing the polarization state of laser 20 results in optical signal 22 having another wavelength different than the default wavelength. Accordingly, responsive to control from controller 4, mode selection device 26a controls the emission of light within optical signal 22 in different wavelengths.

What is claimed is:

1. A light emission method comprising:
   providing a control signal;
   emitting light using a laser capable of operating in two polarization states during the emission of the light;
   adjusting operation of the laser between the polarization states responsive to the control signal; and
   adjusting the wavelength of the light responsive to the adjusting the operation of the laser between the polarization states.

2. The method of claim 1 wherein the emitting light comprises emitting light using the laser provided within a cavity defined by a plurality of mirrors, and the adjusting the wavelength of the light comprises adjusting an index of refraction of at least a portion of an optical path within the cavity responsive to the adjusting the operation of the laser.

3. The method of claim 1 wherein the adjusting the wavelength comprises adjusting using a birefringent material.

4. The method of claim 1 wherein the emitting light comprises emitting light using the laser provided within a cavity defined by a plurality of mirrors, and wherein the adjusting the operation of the laser comprises injecting external light into the cavity.

5. The method of claim 4 further comprising providing the external light using an external light source.

6. The method of claim 1 wherein the emitting light comprises emitting light using the laser provided within a cavity defined by a plurality of mirrors, and the wherein the adjusting the operation of the laser comprises inducing loss for one of the polarization states of the laser within the cavity.

7. The method of claim 6 wherein the inducing loss comprises inducing loss using a controllable birefringent material positioned within the cavity.

8. A light emission method comprising:
   providing a semiconductor laser;
   controlling an operation of the semiconductor laser in two polarization states; and
   emitting light having two wavelengths using the semiconductor laser, wherein the two wavelengths correspond to respective ones of the two polarization states.

9. The method of claim 8 wherein the controlling comprises controlling the semiconductor laser to operate in a first polarization state, and the emitting light comprises emitting light having a first wavelength during the operation of the semiconductor laser in the first polarization state, and the controlling further comprises controlling the semiconductor laser to operate in a second polarization state, and the emitting light further comprises emitting light having a second wavelength different than the first wavelength during the operation of the semiconductor laser in the second polarization state.

10. The method of claim 8 wherein the providing comprises providing a cavity defining an optical path about the semiconductor laser, and further comprising adjusting an index of refraction of at least a portion of the optical path corresponding to the two polarization states of the semiconductor laser to emit the light having the two wavelengths.

11. The method of claim 10 wherein the adjusting comprises adjusting using birefringent material.

12. The method of claim 8 wherein the providing comprises providing a cavity about the semiconductor laser, and the controlling comprises injecting light into the cavity to control the operation of the semiconductor laser in the two polarization states.

13. The method of claim 8 wherein the providing comprises providing a cavity about the semiconductor laser and a controllable birefringent material, and the controlling comprises controlling the controllable birefringent material to control the operation of the semiconductor laser in the two polarization states.

14. A light emission device comprising:
   an interface adapted to receive a control signal;
   a laser configured to operate in two polarization states to emit light;
   a mode selection device configured to adjust the polarization state of the laser responsive to the control signal; and
   a wavelength adjustment device configured to adjust the wavelength of the light responsive to the adjustment of the polarization state.

15. The device of claim 14 wherein the wavelength adjustment device is provided intermediate a plurality of mirrors which define a cavity containing the laser, and the wavelength adjustment device has a plurality of indexes of refraction corresponding to respective ones of the two polarization states.

16. The device of claim 15 wherein the wavelength adjustment device comprises birefringent material.

17. The device of claim 14 further comprising a plurality of mirrors which define a cavity containing the laser, and wherein the mode selection device is configured to inject external light into the cavity to control the polarization state of the laser.

18. The device of claim 17 wherein the mode selection device comprises an external light source configured to inject the external light responsive to the control signal.

19. The device of claim 14 further comprising a plurality of mirrors which define a cavity containing the laser, and wherein the mode selection device is configured to induce loss for one of the two polarization states of the laser within the cavity responsive to the control signal.

20. The device of claim 19 wherein the mode selection device comprises a controllable birefringent material within the cavity.

* * * * *